United States Patent
Quoirin et al.

(10) Patent No.: US 7,683,454 B2
(45) Date of Patent: Mar. 23, 2010

(54) MOS POWER COMPONENT WITH A REDUCED SURFACE AREA

(75) Inventors: Jean-Baptiste Quoirin, Tours (FR); Frédéric Lanois, Tours (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/762,592

(22) Filed: Jan. 22, 2004

(65) Prior Publication Data
US 2005/0127434 A1 Jun. 16, 2005

(30) Foreign Application Priority Data
Dec. 5, 2003 (FR) .................... 03 50989

(51) Int. Cl.
*H01L 29/00* (2006.01)
(52) U.S. Cl. .............. 257/502; 257/328; 257/341; 257/506; 257/621
(58) Field of Classification Search ......... 257/327–329, 257/341, 368, 502, 508, 520, 621
See application file for complete search history.

(56) References Cited

U.S. PATENT DOCUMENTS

| | | | | |
|---|---|---|---|---|
| 4,933,739 A * | 6/1990 | Harari | ............ | 257/621 |
| 6,114,768 A * | 9/2000 | Gaul et al. | ............ | 257/777 |
| 6,229,194 B1 * | 5/2001 | Lizotte | ............ | 257/506 |
| 6,362,505 B1 * | 3/2002 | Tihanyi | ............ | 257/329 |
| 6,459,142 B1 * | 10/2002 | Tihanyi | ............ | 257/621 |
| 6,525,375 B1 | 2/2003 | Yamaguchi et al. | | |
| 6,525,383 B1 * | 2/2003 | Stecher | ............ | 257/401 |
| 6,781,198 B2 * | 8/2004 | Disney | ............ | 257/329 |
| 2002/0040994 A1 * | 4/2002 | Nitta et al. | ............ | 257/328 |
| 2002/0063281 A1 * | 5/2002 | Tihanyi | ............ | 257/328 |
| 2003/0141514 A1 | 7/2003 | Yamaguchi et al. | | |
| 2003/0151077 A1 * | 8/2003 | Mathew et al. | ............ | 257/250 |
| 2004/0043565 A1 * | 3/2004 | Yamaguchi et al. | ......... | 438/268 |

FOREIGN PATENT DOCUMENTS

EP  1 094 525 A2  4/2001
JP  06151863 A  *  5/1994

OTHER PUBLICATIONS

French Search Report from corresponding French National Application No. 03/50989 filed Dec. 5, 2003.
U.S. Appl. No. 10/763,579, filed Jan. 22, 2004, Jean-Luc Morand.
U.S. Appl. No. 10/763,070, filed Jan. 22, 2004, Jean-Luc Morand.

* cited by examiner

*Primary Examiner*—Matthew E Warren
(74) *Attorney, Agent, or Firm*—Lisa K. Jorgenson; James H. Morris; Wolf, Greenfield & Sacks, P.C.

(57) ABSTRACT

A MOS power component in which the active regions extend perpendicularly to the surface of a semiconductor chip substantially across the entire thickness thereof. A MOS power transistor according to the present invention alternately includes a source region of a first conductivity type, an intermediary region, and a drain region of the first conductivity type, each of these regions extending across the entire thickness of the substrate, the source and drain regions being contacted by conductive fingers or plates substantially crossing the substrate, insulated and spaced apart conductive fingers crossing from top to bottom the intermediary region, the horizontal distance between the insulated fingers being such that the intermediary region can be inverted when an appropriate voltage is applied to these insulated fingers.

57 Claims, 3 Drawing Sheets

MOS POWER COMPONENT WITH A REDUCED SURFACE AREA

BACKGROUND OF THE INVENTION

1. Field of the Invention

The present invention relates to a novel type of MOS-type semiconductor power component, this component being generally called a discrete component although several such components may be provided on the same chip, and/or they can be associated with logic circuits provided on the same chip.

2. Discussion of the Related Art

Figure 1A:
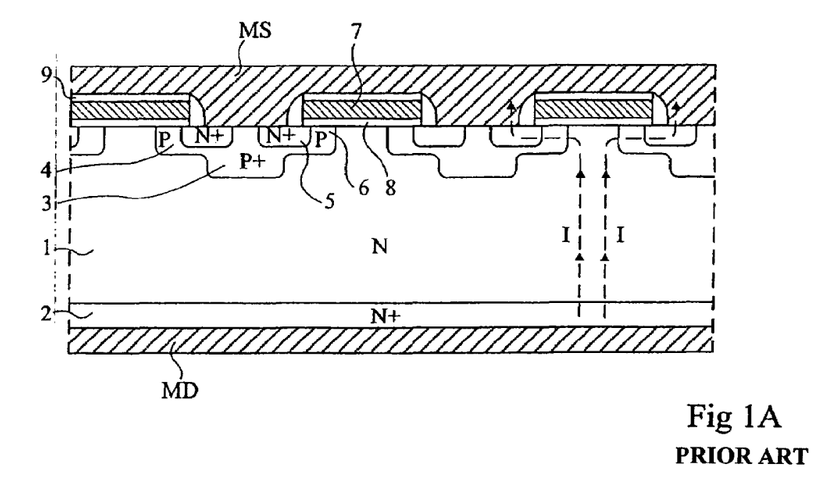
FIGS. 1A and 1B, previously described, are simplified cross-section and top views of a conventional vertical MOS transistor structure.
Figure 1B:
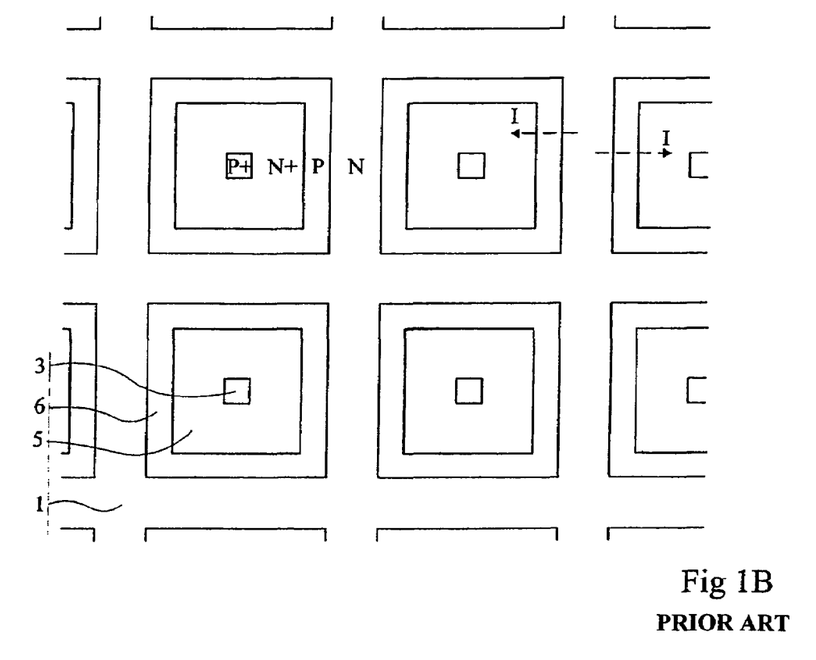

FIGS. 1A and 1B are a partial cross-section view and a top view of an example of the structure of a conventional multicellular vertical MOS power component.

This transistor is formed from a lightly-doped N-type layer or substrate 1 including, on its rear surface side, a heavily-doped N-type layer 2 ($N^+$). Conversely to what is shown, the $N^+$ layer may be much thicker than the N substrate. On the upper surface side of substrate 1 are formed P wells including a more heavily doped central portion 3 and a more lightly doped peripheral portion 4. Substantially at the center of the P wells is formed a heavily-doped N-type ring 5. Portion 6 of the P well external to N well 5 is topped with a conductive gate 7 insulated by a thin insulating layer 8. The upper surface and the lateral surface of gate 7 are insulated by an insulating layer 9 and the assembly is coated with a source metallization MS. The lower surface of the component is coated with a drain metallization MD. All the gates 7 are connected to a common gate terminal, not shown.

FIG. 1B is a top view of the structure without the gate and source metallization MS. The same elements are designated therein with the same references as in FIG. 1A.

For the simplicity of the drawing, each cell has been shown according to a square pattern. Other shapes are possible and currently used. When the source is negative with respect to the drain and the gate is properly biased, the current flows from the drain to the source, through the channel region in the direction of arrows 1 illustrated in FIGS. 1A and 1B in a portion of the structure. Similar currents flow from each of the cells. These currents essentially flow vertically, whereby the MOS transistor is said to be vertical.

A disadvantage of vertical MOS power transistors is their on-state resistance. Indeed, practical considerations make it difficult to optimize the thicknesses of the various layers and regions according to the desired transistor characteristics. In particular, the thickness of N-type layer 1 must be sufficiently high for the component to have a desired breakdown voltage but must also be as small as possible to limit the on-state resistance of the component. N+ layer 2 is used to take an ohmic drain contact on the rear surface. Its thickness could be reduced to a few micrometers, but this would lead to too thin silicon wafer thicknesses (<100 μm), incompatible with current production tools. Very thick $N^+$ layers 2 (of a few hundreds of micrometers) are thus used. This layer then introduces an additional series resistance that reduces the on-state performances of the transistor.

Another disadvantage of vertical components is that the channel width (perimeter of P wells 4) depends in particular on the surface of the semiconductor chip taken up by the transistor and cannot be increased beyond certain limits.

A MOS transistor has been described, only as an example of a vertical MOS-type component. The problems indicated hereabove generally relate to MOS power or vertical high-power components, for example, insulated-gate bipolar transistors (IGBT) and other voltage-control enrichment or depletion components, of MOS or Schottky-MOS type.

SUMMARY OF THE INVENTION

The present invention aims at providing novel types of semiconductor MOS power or high-voltage components enabling avoiding at least some of the above-mentioned disadvantages of vertical components, in particular increasing the active junction surface with respect to the surface area of the chip in which the component is formed, and reducing the on-state voltage drop.

To achieve these and other objects, the present invention provides a MOS power component in which the active regions extend perpendicularly to the surface of a semiconductor chip substantially across the entire thickness thereof.

According to an embodiment of the present invention, the contacts with the regions to be connected are taken by conductive fingers substantially crossing the entire region with which a contact is desired to be established.

According to an embodiment of the present invention, the conductive fingers are metal fingers.

According to an embodiment of the present invention, the junctions or limits between regions are arranged in planes perpendicular to the main chip surfaces.

According to an embodiment of the present invention, the junctions or limits between regions are formed of several cylinders perpendicular to the main chip surfaces.

A MOS power transistor according to the present invention alternately comprises a source region of a first conductivity type, an intermediary region, and a drain region of the first conductivity type, each of these regions extending across the entire thickness of the substrate, the source and drain regions being contacted by conductive fingers or plates substantially crossing the substrate, insulated and spaced apart conductive fingers crossing from top to bottom the intermediary region, the horizontal distance between the insulated fingers being such that the intermediary region can be inverted when an appropriate voltage is applied to these insulated fingers.

According to an embodiment of the present invention, the conductive fingers penetrating into lightly-doped N-type regions are surrounded with heavily-doped N-type regions.

An IGBT transistor according to the present invention alternately comprises a source region of a first conductivity type, an intermediary region, a drain region of the first conductivity type, and an additional region of the second conductivity type, each of these regions extending across the entire substrate thickness, the source region and the additional region being contacted by conductive fingers or plates substantially crossing the substrate, insulated and spaced apart conductive fingers crossing from top to bottom the intermediary region, the horizontal region between the insulated fingers being such that the intermediary region can be inverted when an appropriate voltage is applied to these insulated fingers.

According to an embodiment of the present invention, each of the conductive fingers is respectively connected to a source metallization, to a gate metallization, and to a drain metallization.

According to an embodiment of the present invention, localized metallizations extend vertically between the source region and the intermediary region to form localized short-circuits.

According to an embodiment of the present invention, the insulated and spaced apart conductive fingers are formed from conductive fingers crossing the entire thickness of the chip, the walls of which are oxidized and which are filled with doped polysilicon.

The foregoing objects, features, and advantages of the present invention will be discussed in detail in the following non-limiting description of specific embodiments in connection with the accompanying drawings.

DETAILED DESCRIPTION

As conventional in the field of semiconductor representation, the various drawings are not to scale. Especially, in these various drawings, the lateral dimensions have been greatly exaggerated with respect to the vertical directions. Indeed, a silicon wafer currently has a thickness of from 300 to 500 μm—and greater thicknesses may be chosen for an implementation of the present invention—while patterns and vias may be defined according to dimensions on the order of from 5 to 50 μm.

Figure 2A:
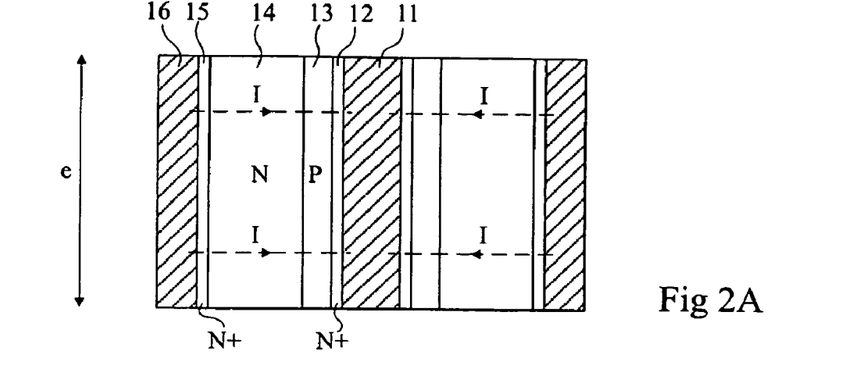
FIG. 2A is a simplified cross-section view of an embodiment of a MOS transistor according to the present invention.

FIG. 2A is a simplified cross-section view of a portion of a semiconductor wafer in which is formed an assembly of MOS transistor cells according to the present invention. The main surfaces of the component correspond to the upper and lower surfaces of a semiconductor wafer, and the vertical dimension, the height of which is designated as e, corresponds to the thickness of the semiconductor wafer.

Figure 2B:
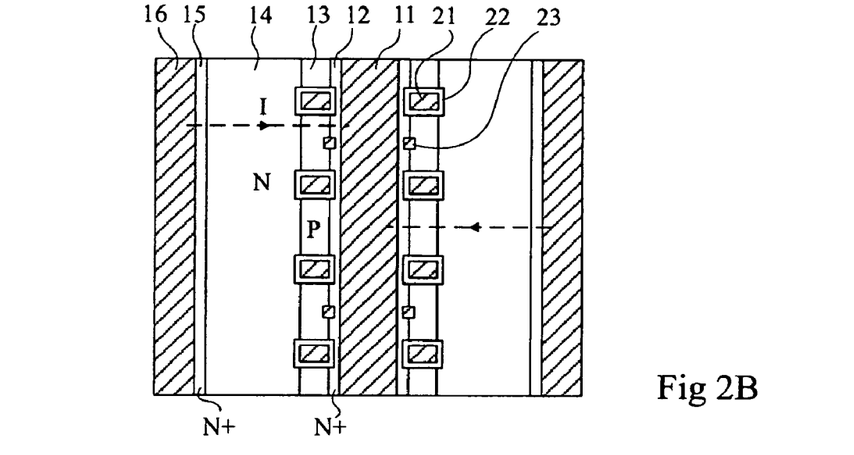
FIG. 2B is a simplified top view of an embodiment of a MOS transistor according to the present invention.
Figure 2C:
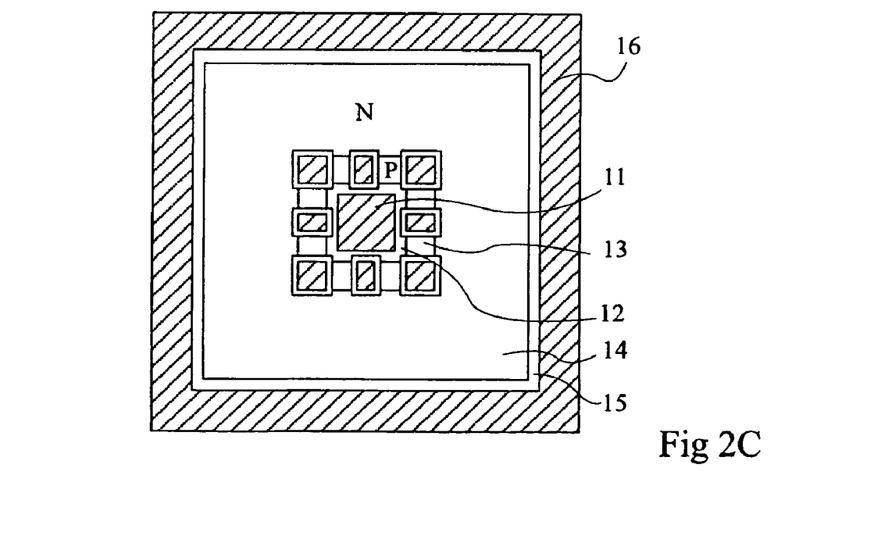
FIG. 2C is a simplified top view of another embodiment of a MOS transistor according to the present invention.

FIGS. 2B and 2C are two simplified examples of top views of the structure formed in the semiconductor substrate, both corresponding to the cross-section view of FIG. 2A.

An elementary cell according to the present invention comprises a conductive finger 11 extending across the entire wafer thickness or across a major part of this thickness. Conductive finger 11 is bordered with a heavily-doped N-type region 12 ($N^+$), itself bordered with a P-type intermediary region 13, then with a lightly-doped N-type region 14, and a heavily-doped N-type region 15 serving as an ohmic contact recovery with a conductive finger 16. Since conductive finger 11, regions 12, 13, 14, and 15 and conductive finger 16 extend substantially across the entire substrate thickness, and the junctions or limits between these elements are substantially vertical. Conductive finger 11 corresponds to a source metallization, region 12 corresponds to a source area, intermediary region 13 corresponds to the area in which a channel can be formed, region 14 corresponds to a drain area, region 15 corresponds to a drain contact recovery layer, and finger 16 corresponds to a drain metallization.

FIG. 2B is a top view of the present invention in an embodiment in which the conductive fingers are made in the form of vertical conductive plates extending in trenches made in a semiconductor substrate.

The embodiment of the MOS transistor gate according to the present invention can be better seen in FIG. 2B. This gate is formed by means of spaced apart conductive fingers 21 surrounded with an insulating layer 22 extending vertically in intermediary region 13. When a positive voltage is applied between gate fingers 21 and source finger 11, a channel forms in the vertical area of intermediary region 13 comprised between two gate fingers, so that the MOS transistor becomes conductive between its source and its drain, and a current indicated by arrows 1 is likely to flow horizontally from the drain to the source. An enrichment MOS transistor has been described hereabove; in the case of a depletion MOS transistor, intermediary region 13, at least in the vicinity of the gate insulator, would be lightly doped of type N and the application of a voltage between gate fingers 21 and source finger 11 would make the MOS transistor non-conductive between its source and its drain.

Conductive fingers 23 penetrating into all or part of the substrate thickness and enabling establishing a short-circuit between intermediary well 13 and source region 12 have also been shown in FIG. 2B, which forms the equivalent of the short-circuit established by source metallization MS of FIG. 1A between $N^+$ ring 5 and the central portion of P well 3.

FIG. 2C illustrates in top view another embodiment of a component according to the present invention in which each MOS transistor cell exhibits a closed contour. Central source finger 11 is surrounded with an $N^+$-type ring-shaped region 12, itself surrounded with a P-type intermediary ring-shaped region 13, an N-type ring-shaped region 14, and an N-type heavily-doped ring-shaped region 15 ($N^+$). In FIG. 2C, the structure has been shown as completely surrounded with a conductive ring 16. In practice, this ring may be formed of a succession of conductive fingers close to one another. To simplify the representation, conductive fingers 23 have not been shown in FIG. 2C.

The drain, gate, and source metallizations have not been shown in FIGS. 2A, 2B, and 2C. It should be understood that all gate fingers 21 are connected to a same metallization, all source fingers 11 are connected to a same metallization, and all drain fingers 16 are connected to a same metallization. Preferably, as in a conventional component, the drain and source metallizations are formed on two opposite surfaces of the semiconductor chip. According to an advantage of the present invention, the gate metallization may, as chosen and as simply, be formed on the drain side or on the source side, which simplifies monolithic assemblies of components according to the present invention.

The forming of a component according to the present invention will readily occur to those skilled in the art who may use conventional techniques for forming openings in the form of vias or trenches, for doping from the openings thus formed, then for filling these openings with a conductor, for example, a metal, for example, copper, this filling being preceded or not by the forming of an insulating layer. It should be understood that, although terms via or finger are used in the present invention, these terms also encompass trench-shaped structures such as those in FIG. 2B or ring-shaped structures such as metallization 16 of FIG. 2C.

The above description essentially aims at the MOS transistor structure and the order of the manufacturing steps may be modified.

As indicated previously, the present invention applies not only to a MOS transistor, but also generally to any MOS power or high-voltage component, for example insulated-gate bipolar transistors (IGBT) and other enrichment or depletion voltage-controlled components, of MOS or Schottky-MOS type. In particular, it can be simply changed from the MOS transistor structure of FIG. 2 to an IGBT structure by replacing heavily-doped N-type layer 15 with a heavily-doped P-type layer.

According to an advantage of the present invention, the channel width per surface area unit is much greater than that obtained in a vertical diffused MOS transistor (VDMOS) such as that of FIG. 1, as well as the total surface area of the drain of the cell assembly may be greater than the surface area of the chip containing these cells.

Another advantage of the present invention is that it is possible to form several components according to the present invention in the same semiconductor layer, with each of these components being easy to surround with insulating walls formed in any chosen fashion. Examples of such assemblies will be given in FIGS. 3 and 4.

Figure 3A:
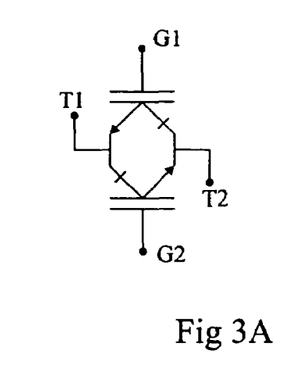
FIGS. 3A and 3B respectively are a circuit diagram and a simplified cross-section view of an assembly in parallel and in opposition of two IGBT transistors according to the present invention.

FIG. 3A shows the diagram of an antiparallel assembly of two IGBT transistors according to the present invention comprising two main terminals T1 and T2 and two control terminals G1 and G2. In the following description, the main terminals of the IGBT transistor will be called the source and the drain to simplify the analogy with the previously-described MOS transistor.

Figure 3B:
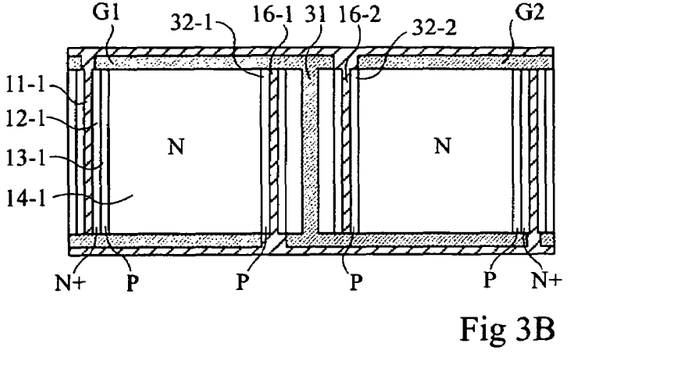

FIG. 3B shows a simplified example of the forming of such an assembly in which the same elements as in FIG. 2A are designated with the same reference numerals. The left-hand portion of the drawing shows an IGBT transistor comprising a source finger 11-1, surrounded with an $N^+$ region 12-1, an intermediary region 13-1 crossed by gate fingers that are not visible in the drawing. An N-type region 14-1 extends between region 13-1 and a $P^+$-type region 32-1 that surrounds a drain finger 16-1. This assembly is separated by an insulating wall 31 from a structure arranged symmetrically with respect to this wall and comprising a drain finger 16-2 surrounded with a $P^+$ region 32-2 and separated by a lightly-doped N-type region 14-2 from an intermediary region 13-2 in which a channel is likely to form and into which gate fingers, not shown, penetrate. Intermediary region 13-2 is in contact with a heavily-doped N-type region 12-2 in contact with a source finger 11-2. Although a single cell has been shown, it should be understood that each of the structures is formed of a cell assembly, as described previously. The source fingers of the cells located to the left of the insulating wall are solid with an upper metallization T1, as well as drain fingers 16-2 of the cells arranged to the right of the insulating wall. Drain fingers 15-1 of the cells located to the left of the insulating wall are connected to a lower metallization T2, as well as source fingers 11-2 of the cells located to the right of the insulating wall. Connections G1 and G2, of which it should be noted that they may easily be formed on the same surface of the component, have only been shown symbolically.

This structure has, as compared to monolithic structures assembling conventional vertical IGBT transistors, the advantage that the two IGBT transistors are perfectly symmetrical and that the transistors characteristics are also perfectly symmetrical.

The structures according to the present invention further enable associating MOS components such as described hereabove also formed with vertical junctions (perpendicular to the main substrate surfaces).

Figure 4A:
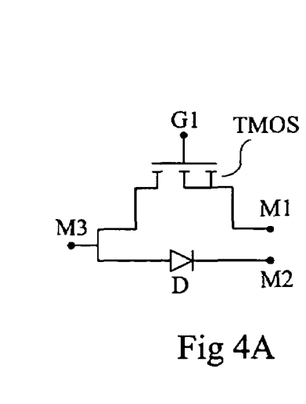
FIGS. 4A and 4B respectively are a circuit diagram and a simplified cross-section view of an assembly of a MOS transistor according to the present invention and of a fast diode.

FIG. 4A shows an example of such an association, comprising a MOS transistor, TMOS, and a diode, D, the anode of the diode being connected to the drain of the MOS transistor. This circuit forms an element currently used in practice and difficult to integrate with conventional technologies.

Figure 4B:
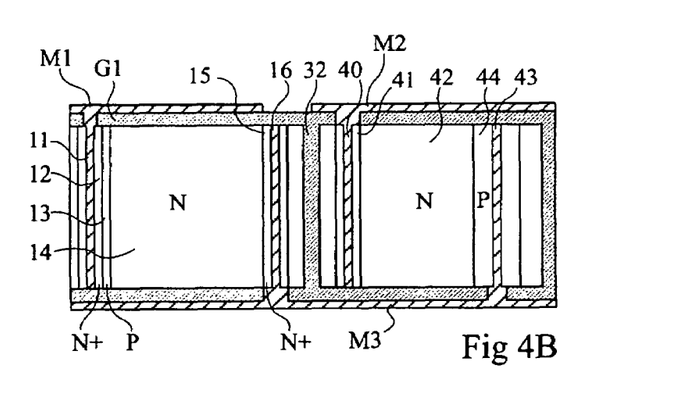

FIG. 4B shows an embodiment of such a structure. In FIG. 4B, the left-hand portion is strictly identical to the left-hand portion of FIG. 3B except that the P-type region surrounding the drain region is replaced with an $N^+$-type region to form a MOS transistor. The MOS transistor comprises a source finger 11, a source region 12, an intermediary region 13, a drain region 14, and a drain finger 16 surrounded with a heavily-doped N-type region 15. This assembly is separated by an insulating wall 32 from a diode structure comprising a cathode finger 40 surrounded with a heavily-doped N-type region 41 and separated, by a lightly-doped N-type region 42, from an anode finger 43 surrounded with a P-type region 44. The source finger of the MOS transistor is connected to a first main metallization M1. The gate fingers (not shown) are connected to a control metallization G1. Cathode finger 40 of the diode is connected to a metallization M2. The drain fingers of the MOS transistor cells as well as anode fingers 43 of the diode cells are connected to a metallization M3. In the shown example, metallization M3 is on the rear surface side and metallizations M1, M2, and G1 are on the front surface side.

The various illustrated structures are likely to have various alterations and modifications, and those skilled in the art should note the alterations described for certain embodiment apply to other embodiments.

On the other hand, many embodiments will readily occur to those skilled in the art, and will be possible according to the technical development, the forming of conductive fingers or of plates formed in trenches only being examples of possible approaches of the forming of structures with vertical limits or junctions.

It should be noted that, since more current per surface area unit of the chip may flow through a MOS transistor according to the present invention than through a conventional MOS transistor, more heat will be generated per surface area unit when the transistor is on (although the on-state voltage drop is smaller due to the possible optimization of the thickness of the reverse voltage hold layer). However, this heat may advantageously be extracted by means of the through conductive fingers. Indeed, metal fingers have a heat conductivity from 2 to 3.5 times greater than the equivalent silicon volume. These fingers may take up a large surface area and, in particular, the peripheral "fingers" may take up the entire free surface area between elementary cells of a component.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A MOS-type power component in which each of the source, gate and drain regions constitutive of the component extend perpendicularly to a surface of a semiconductor chip substantially across an entire thickness of the semiconductor chip.

2. The component of claim 1, wherein contacts with the source and drain regions are made by conductive fingers that extend substantially across the entire thickness of the semiconductor chip.

3. The component of claim 2, wherein the conductive fingers are metal fingers.

4. The component of claim 1, wherein junctions or limits between regions are arranged in planes perpendicular to a main chip surface.

5. The component of claim 1, wherein junctions or limits between regions are formed of several cylinders perpendicular to a main chip surface.

6. The MOS-type power component of claim 1, alternately comprising a source region of a first conductivity type, an intermediary region, and a drain region of the first conductivity type, each of these regions extending across the entire thickness of a substrate, the source and drain regions being contacted by conductive fingers or plates substantially crossing the substrate, insulated and spaced apart conductive fingers crossing from top to bottom the intermediary region, a horizontal distance between the insulated fingers being such that the intermediary region can be inverted when an appropriate voltage is applied to these insulated fingers.

7. The MOS-type power component of claim 6, wherein the conductive fingers penetrate into lightly-doped N-type regions and are surrounded with heavily-doped N-type regions.

8. The MOS-type power component of claim 1 comprising an IGBT transistor, the IGBT transistor comprising a source region of a first conductivity type, an intermediary region, a drain region of the first conductivity type, and an additional region of the second conductivity type, each of these regions extending across an entire substrate thickness, the source region and the additional region being contacted by conductive fingers or plates substantially crossing a substrate, insulated and spaced apart conductive fingers crossing from top to bottom the intermediary region, a horizontal region between the insulated fingers being such that the intermediary region can be inverted when an appropriate voltage is applied to these insulated fingers.

9. The MOS-type power component of claim 6, wherein each of the conductive fingers is respectively connected to a source metallization, to a gate metallization, or to a drain metallization.

10. The MOS-type power component of claim 6, wherein localized metallizations extend vertically between the source region and the intermediary region to form localized short-circuits.

11. The MOS-type power component of claim 6, wherein the insulated and spaced apart conductive fingers are formed from conductive fingers crossing the entire thickness of the chip, the walls of which are oxidized and which are filled with doped polysilicon.

12. The MOS-type power component or IGBT transistor of claim 8, wherein each of the conductive fingers is respectively connected to a source metallization, to a gate metallization, or to a drain metallization.

13. The MOS-type power component or IGBT transistor of claim 8, wherein localized metallizations extend vertically between the source region and the intermediary region to form localized short-circuits.

14. The MOS-type power component or IGBT transistor of claim 8, wherein the insulated and spaced apart conductive fingers are formed from conductive fingers crossing the entire thickness of the chip, the walls of which are oxidized and which are filled with doped polysilicon.

15. A MOS-type power component comprising:
a substrate;
semiconductor regions extending through the substrate;
a gate region that extends substantially through an entire thickness of the substrate; and
contacts extending through the substrate and contacting the semiconductor regions within the substrate;
wherein the contacts are metal fingers.

16. The MOS-type power component of claim 1, wherein the source region has a first conductivity type and an intermediary region has a second conductivity type.

17. The MOS-type power component of claim 1, wherein the source region has a first conductivity type and the drain region has the first conductivity type.

18. The MOS-type power component of claim 15, wherein an interface between the semiconductor regions is arranged as a plane perpendicular to a surface of the substrate.

19. The MOS-type power component of claim 15, wherein an interface between the semiconductor regions is arranged as a cylinder perpendicular to a surface of the substrate.

20. The MOS-type power component of claim 15, further comprising:
a source region of a first conductivity type extending through the substrate;
an intermediary region extending through the substrate;
insulated conductive fingers extending through the intermediary region, a spacing between the insulated conductive fingers being such that the conductivity of the intermediary region can be altered when a voltage is applied to the insulated conductive fingers; and
a drain region of the first conductivity type extending through the substrate, the source and drain regions being contacted by at least one of the contacts.

21. The MOS-type power component of claim 20, wherein the contacts contact heavily-doped N-type regions.

22. The MOS-type power component of claim 15, wherein the MOS-type power component is an IGBT transistor, the IGBT transistor comprising:
a source region of a first conductivity type extending through the substrate being contacted by at least one of the contacts;
an intermediary region extending through the substrate;
a drain region of the first conductivity type extending through the substrate;
an additional region of the second conductivity type extending though the substrate and being contacted by at least one of the contacts; and
insulated conductive fingers extending through the intermediary region, a spacing between the insulated conductive fingers being such that the conductivity of the intermediary region can be altered when a voltage is applied to the insulated conductive fingers.

23. The MOS-type power component of claim 20, wherein each of the contacts is respectively connected to a source metallization, a gate metallization, or a drain metallization.

24. The MOS-type power component of claim 20, wherein localized metallizations extend vertically between the source region and the intermediary region to form localized short-circuits.

25. The MOS-type power component of claim 20, wherein the insulated conductive fingers are formed at least partially of polysilicon and are insulated by an oxide layer.

26. The LGBT transistor of claim 22, wherein each of the contacts is respectively connected to a source metallization, to a gate metallization, or a drain metallization.

27. The IGBT transistor of claim 22, wherein metallizations extend vertically between the source region and the intermediary region to form short-circuits.

28. The IGBT transistor of claim 22, wherein the insulated conductive fingers are formed at least partially of polysilicon and are insulated by an oxide layer.

29. The MOS-type power component of claim 15, wherein all of the semiconductor regions extend through the substrate.

30. The MOS-type power component of claim 15, wherein all of the contacts which contact the semiconductor regions extend through the substrate.

31. A MOS-type power component in which semiconductor regions extend perpendicularly to a surface of a semiconductor chip substantially across an entire thickness thereof, wherein contacts with the semiconductor regions are made substantially across the entire thickness of the semiconductor chip by conductive fingers, wherein the MOS-type power component comprises a gate region that extends substantially though an entire thickness of the semiconductor chip.

32. The component of claim 31, wherein the conductive fingers are metal fingers.

33. The component of claim 31, wherein junctions or limits between the semiconductor regions are arranged in planes perpendicular to a main chip surface.

34. The component of claim 31, wherein junctions or limits between the semiconductor regions are formed of several cylinders perpendicular to a main chip surface.

35. The MOS-type power component of claim 31, further comprising:
 a source region of a first conductivity type;
 an intermediary region; and
 a drain region of the first conductivity type, each of the source, intermediary and drain regions extending across the entire thickness of the semiconductor chip, the source and drain regions being contacted by conductive fingers or plates substantially crossing the substrate;
 insulated and spaced apart conductive fingers crossing from top to bottom the intermediary region, a horizontal distance between the insulated fingers being such that the intermediary region can be inverted when a voltage is applied to these insulated conductive fingers.

36. The MOS-type power component of claim 35, wherein the conductive fingers penetrate into lightly-doped N-type regions and are surrounded with heavily-doped N-type regions.

37. The MOS-type power component of claim 31, wherein the MOS-type power component is an IGBT transistor, the IGBT transistor comprising:
 a source region of a first conductivity type;
 an intermediary region;
 a drain region of the first conductivity type; and
 an additional region of the second conductivity type, wherein each of the source, intermediary, drain and additional regions extend across an entire substrate thickness, the source region and the additional region being contacted by conductive fingers or plates substantially crossing a substrate; and
 insulated and spaced apart conductive fingers crossing from top to bottom the intermediary region, a horizontal region between the insulated fingers being such that the intermediary region can be inverted when a voltage is applied to these insulated fingers.

38. The MOS-type power component of claim 35, wherein each of the conductive fingers is respectively connected to a source metallization, to a gate metallization, or to a drain metallization.

39. The MOS-type power component of claim 35, wherein localized metallizations extend vertically between the source region and the intermediary region to form localized short-circuits.

40. The MOS-type power component of claim 35, wherein the insulated and spaced apart conductive fingers are formed in trenches in the semiconductor chip, the walls of which are oxidized and which are filled with doped polysilicon to form the conductive fingers.

41. The IGBT transistor of claim 37, wherein each of the conductive fingers is respectively connected to a source metallization, to a gate metallization, or to a drain metallization.

42. The IGBT transistor of claim 37, wherein localized metallizations extend vertically between the source region and the intermediary region to form localized short-circuits.

43. The IGBT transistor of claim 37, wherein the insulated and spaced apart conductive fingers are formed in trenches in the semiconductor chip, the walls of which are oxidized and which are filled with doped polysilicon to form the conductive fingers.

44. A MOS-type power component, comprising:
 a substrate having a first main surface;
 a gate region that extends substantially through an entire thickness of the substrate;
 a first region and a second region disposed within the substrate such that current flows from the first region to the second region throughout substantially an entire thickness of the substrate, wherein current flow in the first region is substantially parallel to the first main surface; and
 contacts extending though the substrate, wherein the first region is contacted within the substrate by at least one of the contacts;
 wherein the contacts are metal fingers;
 wherein both the first region and the second region extend through the substrate.

45. The MOS-type power component of claim 44, further comprising:
 an interface between the first region and the second region that is arranged as a plane perpendicular to the first main surface.

46. The MOS-type power component of claim 44, further comprising:
 an interface between the first region and the second region that is arranged as a cylinder perpendicular to the first main surface.

47. The MOS-type power component of claim 44, further comprising:
 a source region of a first conductivity type extending through the substrate;
 an intermediary region extending through the substrate;
 insulated conductive fingers extending through the intermediary region, a spacing between the insulated conductive fingers being such that the conductivity of the intermediary region can be altered when a voltage is applied to the insulated conductive fingers; and
 a drain region of the first conductivity type extending through the substrate, the source and drain regions being contacted by at least one of the contacts.

48. The MOS-type power component of claim 44, wherein the contacts contact heavily-doped N-type regions.

49. The MOS-type power component of claim 44, wherein the MOS-type power component is an IGBT transistor, the IGBT transistor comprising:
 a source region of a first conductivity type extending through the substrate being contacted by at least one of the contacts;
 an intermediary region extending through the substrate;
 a drain region of the first conductivity type extending through the substrate;
 an additional region of the second conductivity type extending through the substrate and being contacted by at least one of the contacts; and insulated conductive fingers extending through the intermediary region, a spacing between the insulated conductive fingers being such that the conductivity of the intermediary region can be altered when a voltage is applied to the insulated conductive fingers.

50. The MOS-type power component of claim 47, wherein each of the contacts is respectively connected to a source metallization, a gate metallization, or a drain metallization.

51. The MOS-type power component of claim 47, wherein localized metallizations extend vertically between the source region and the intermediary region to form localized short-circuits.

52. The MOS-type power component of claim 47, wherein the insulated conductive fingers are formed at least partially of polysilicon and are insulated by an oxide layer.

53. The IGBT transistor of claim 49, wherein each of the contacts is respectively connected to a source metallization, to a gate metallization, or a drain metallization.

54. The IGBT transistor of claim 49, wherein metallizations extend vertically between the source region and the intermediary region to form short-circuits.

55. The IGBT transistor of claim 49, wherein the insulated conductive fingers are formed at least partially of polysilicon and are insulated by an oxide layer.

56. The MOS-type power component of claim 44, wherein all of the contacts associated with the MOS-type power component have at least a portion that extends through the substrate.

57. The MOS-type power component of claim 44, wherein the first region has a first conductivity type and the second region has a second conductivity type.

* * * * *

UNITED STATES PATENT AND TRADEMARK OFFICE
CERTIFICATE OF CORRECTION

PATENT NO. : 7,683,454 B2 Page 1 of 1
APPLICATION NO. : 10/762592
DATED : March 23, 2010
INVENTOR(S) : Jean-Baptiste Quoirin et al.

It is certified that error appears in the above-identified patent and that said Letters Patent is hereby corrected as shown below:

Col. 1, line 41 should read:
--direction of arrows I illustrated in Figs. 1A and 1B in a--.

Col. 4, line 14 should read:
--indicated by arrows I is likely to flow horizontally from the--.

Col. 8, claim 22, line 42 should read:
--extending through the substrate being contacted by at--.
    claim 26, line 59 should read:
--The IGBT transistor of claim 21, wherein each of the--.

Col. 9, claim 31, line 13, should read:
--through an entire thickness of the semiconductor chip.--.

Col. 10, claim 44, line 25, should read:
--contacts extending through the substrate, wherein the first--.

Signed and Sealed this

Eleventh Day of May, 2010

David J. Kappos
*Director of the United States Patent and Trademark Office*